United States Patent [19]

Risch et al.

[11] Patent Number: 4,486,778
[45] Date of Patent: Dec. 4, 1984

[54] ARRANGEMENT FOR CONTACT-FREE MEASUREMENT OF ELECTRICAL CHARGE IMAGES IN ELECTRO-RADIOGRAPHIC RECORDING METHODS

[75] Inventors: Lothar Risch, Ottobrunn; Ingmar Feigt, Erlangen; Reinhard Tielert, Munich, all of Fed. Rep. of Germany

[73] Assignee: Siemens Aktiengesellschaft, Berlin & Munich, Fed. Rep. of Germany

[21] Appl. No.: 377,085

[22] Filed: May 11, 1982

[30] Foreign Application Priority Data

May 29, 1981 [DE] Fed. Rep. of Germany ....... 3121494

[51] Int. Cl.³ .......................... H04N 5/32; H04N 3/14
[52] U.S. Cl. ................................... 358/111; 358/213; 358/294; 357/24
[58] Field of Search ............... 358/294, 293, 295, 110, 358/111, 213; 357/24 LR, 24 R, 29

[56] References Cited

U.S. PATENT DOCUMENTS 4,134,137  1/1979  Jacobs et al. ........................ 358/293

OTHER PUBLICATIONS

A CCD Multiplexer With Forty AC Coupled Inputs; S. P. Zinmons and T. F. Cheek, Jr., J. T. Hall, P. W. Van Atta, and R. Balierak; 1975 International Conference on the Application of Charge-Coupled Devices, 29-31 Oct.; pp. 43-52.
"Development of a Large-Area Solid-State Image Receptor for X-Ray Images", Technical Annual Report, #N01-CB-74211-35, Oct. 1978, pp. 1-74.
Physik in unserer Zeit, vol. 10, 1979, No. 4, p. 2.

Primary Examiner—Howard W. Britton
Assistant Examiner—John K. Peng
Attorney, Agent, or Firm—Hill, Van Santen, Steadman & Simpson

[57] ABSTRACT

In an exemplary embodiment, an electrical charge image is scanned by a matrix of integrated MOS components with a floating gate (or a switched floating gate), functioning as a matrix of potential sensors, to produce an image signal for display on a video screen. A minimum field effect transistor with source-follower circuitry is preferably employed as the potential sensor; the sensor outputs are linked to a shift register. The new component is suitable for employment for potential measurements in X-ray diagnostics.

17 Claims, 4 Drawing Figures

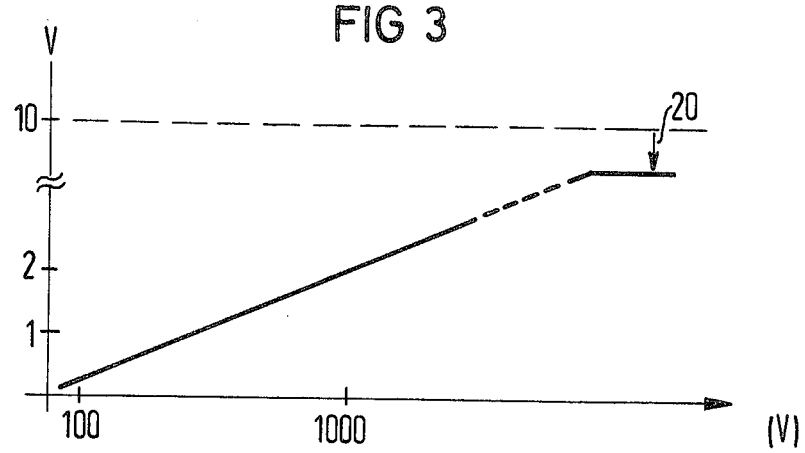
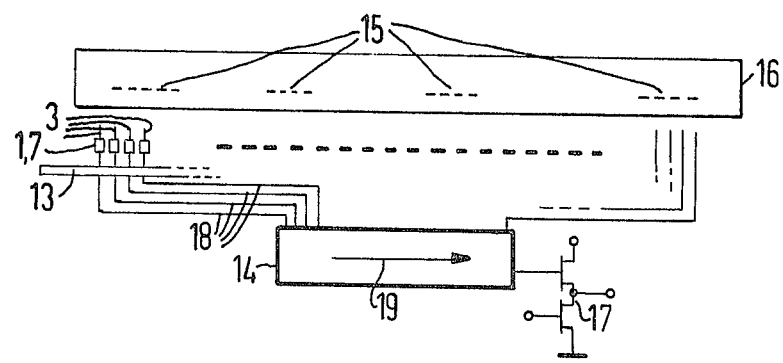

ARRANGEMENT FOR CONTACT-FREE MEASUREMENT OF ELECTRICAL CHARGE IMAGES IN ELECTRO-RADIOGRAPHIC RECORDING METHODS

BACKGROUND OF THE INVENTION

The present invention relattes to an arrangement for contact-free measurement of electrical charge images which are stored as transmission images on a photoconductive plate by means of electro-radiographic recording methods and in which the electrical charge image is scanned to produce a charge-representing signal which is amplified and is output for display on a video screen.

Electro-radiographic recording methods are being increasingly employed in X-ray diagnostics. Thereby, a photoconductive plate, preferably a high-resistance selenium plate, is uniformly charged by means of a corona discharge to a value in the range from 1000 through 3000 volts and is then partially discharged by means of exposure with X-radiation in accord with the imaged object. Thus, the X-ray transmission image is converted into an electrical charge image fixed on the surface of the plate, and said charge image can then be removed by means of a toner and transferred to paper. Therewith, however, the charge on the plate is also again removed, The problem of a source check before the development lies in scanning the charge image from a photoconductive plate and out-putting it onto a picture screen without destroying the charge image, so that the plate can subsequently be supplied for further processing steps, for example, a copying process. Such a source check can be employed both for determining the operating point in the electro-radiographic proces as well as for image representation in the manner of computer radiography.

SUMMARY OF THE INVENTION

The object of the invention is to render this primary check possible by means of a simple readout of the potentials on the photoconductive plate.

In electro-radiography, typical potential differences between the exposed and unexposed photoconductor plate lie at a value between 10 mV and 3000 volts. Further details concerning the employment of electro-radiography with X-rays can be taken from the periodical "Physik in unserer Zeit", Vol. 10, 1979, No. 2, p.2.

A measuring installation for detecting the electrical charge image by means of contact-free scanning as initially described herein, can be derived from the essay "Large-Area-Solid-State Image Receptor for X-Ray Images", from the Technical Annual Report, No. 1-CB-74211-35, October 1978 of the Xerox Corporation in cooperation with SRI. Thereby, 128 small coaxial probes serve as contact-free pickups which are connected in hybrid technology to suitable electrometer amplifiers. Each amplifier is provided with an "antenna" and detects electrical potentials. The output signals of the operational amplifiers are conducted out over separate cables and, after analog-to-digital conversion, are processed in multiplex technology by a computer. The length and resolution of the sensor row is limited by the size of the discrete components and the multitude of cables, for which reason the photoconductor plate is scanned in a X-Y motion. The disadvantage of this system is the extreme microphone sensitivty due to interposition of the long cables as well as due to unsteady functioning of the receiver arrangement. Further, a narrow limit is set for a high resolution.

The invention solves the problem of non-destructive detection of the electrical charge image pattern by means of a measuring installation which is simpler and functions more precisely and which is characterized in that a matrix of integrated MOS (metal-oxide semiconductor) components is provided which are in a position, with a floating gate or with a switched floating gate, with the assistance of a charge induction effect, to identify the respective topical charge state by means of variable conductivity and to effect electrical amplification at the same time. It thereby lies within the framework of the invention that a field effect transistor with a small input capacitance is provided as the sensor, being operated in a source-follower circuit with a further transistor, and that the sensor outputs are directly connected to a charge transfer element (CCD register). It is thereby provided that the arrangement is produced in MOS double polysilicon technology.

As a result of the one-dimensional or two-dimensional periodic arrangement consisting of active sensors in semiconductor technology, according to the teaching of the invention, the great advantage over the known small coaxial probe arrangement derives that detection and amplification lie at the same location in an integrated structure and, thus, the susceptibility to disruption is minimized, and the topical resolution is significantly improved. Moreover, an improvement of the sensitivity of the arrangement is also achieved due to self-amplification (S/N ratio). As a result of the integration in MOS double polysilicon technology, the manufacture of an entire sensor row consisting of individual chips is possible without limit.

Further details concerning the structure and the manner of functioning of the arrangement can be taken from FIGS. 1 through 4 on the accompanying drawing sheets and the appertaining description; and other objects, features and advantages will be apparent from this detailed disclosure and from the appended claims.

BRIEF DESCRIPTION OF THE DRAWINGS

FIG. 3 shows the sensor characteristic; and

FIG. 4 shows the overall arrangement with the object to be measured in an overview.

DETAILED DESCRIPTION

Figure 1:
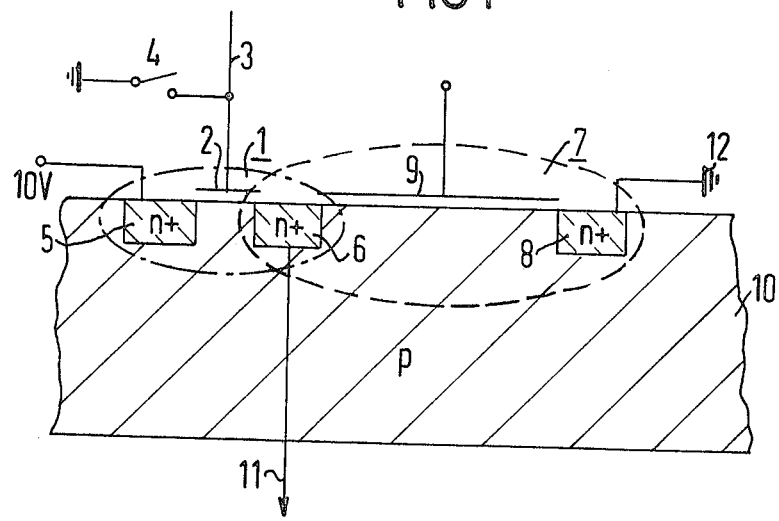
FIG. 1 shows the sensor principle according to the invention.

FIG. 1: The actual sensor consists of the minimum-sized transistor enclosed by the dot-dash line 1, said minimum transistor consisting of a drain region 5 and source region 6 whose gate surface 2 amounts to 5 $\mu$m by 4 $\mu$m. This minimum-sized structure of a MOS transistor 1 produces a self-capacitance of the system of approximately 0.1 through 0.2 pF, whereby a sufficient sensitivity of the field effect transistor is guaranteed. The conductor 3 connected to the gate electrode 2 functions as the antenna for receiving the induced charge. The sensor transistor 1 is operated in a source-follower circuit with a further transistor 7 (area enclosed in broken lines) functioning as the load transistor, whereby the drain region 6 of said load transistor 7 is identical to the source region 6 of the minimum transistor 1. Reference numeral 8 indicates the source region and 9 indicates the gate electrode of the load transistor 7. The source and drain regions of both transistors have been generated as n+ doped regions (5, 6, 8) by means of ion implantation in a p-doped silicon substrate 10.

Due to the small input capacitance, the gate electrode 2 of the minimum transistor 1 is charged by leakage currents. In order to be able to measure "static" potentials, the input must be grounded with a reset transistor 4. The potential can also be "differentially" detected by means of operating the transistor as a resistor.

The diffusion line to the CCD is referenced with the arrow 11. The overall arrangement is grounded at 12.

Figure 2:
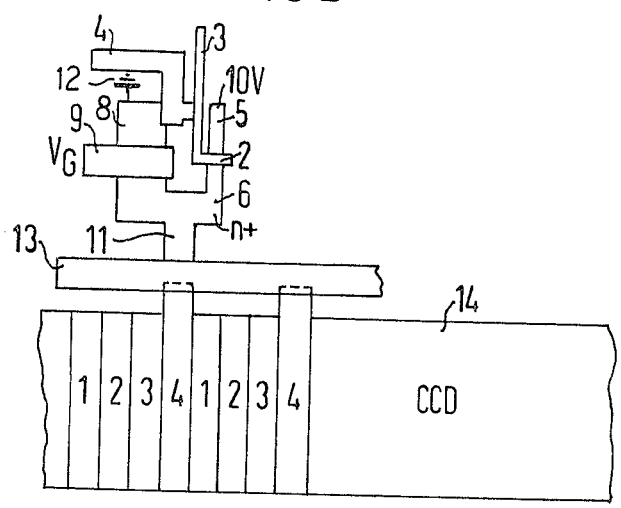
FIG. 2 is a plan view of the arrangement constructed in integrated circuitry.

FIG. 2: The same reference numerals as in FIG. 1 also apply to identical parts of the sensor arrangement illustrated in plan view according to FIG. 2. The potential of the source-sensor region 6 is forwarded by means of a transfer gate 13 to a four-phase shift register 14. Thereby, the transfer gate 13 blocks the diffusion line 11 coming from region 6 and enables the charge to be read into the CCD shift register 14 at the desired time. The known double polysilicon technology is suitable for the manufacture of the CCD shift register 14 and of the sensor element.

FIG. 3: Here, the plate voltage of the image plate is entered as the abscissa and the voltage of the MOS transistor (in region 6) is entered as the ordinate. As can be derived from the curve diagram, the sensor element has a linear characteristic given an assumed distance of the antenna 3 from the charged image plate (selenium plate) of 0.1 cm. Plate voltages between 100 and 1000 volts are transformed into voltage values from 0.2 through 2 volts and are suitable for the drive of the CCD shift register. The sensor characteristic remains linear up to the saturation value which is determined by the drain voltage minus the threshold voltage (see arrow 20).

FIG. 4: The same reference numerals as in FIGS. 1 and 2 also apply here. The selenium plate containing the electrical charge image pattern 15 is referenced with 16, the readout circuit for the CCD shift register 14 is referenced with 17 and the feed lines to the CCD shift register 14 are referenced with 18.

Given a desired resolution of 0.2 mm, fifty sensor elements (1, 7) are required for 1 cm (selenium plate 16) given a 0.1 cm plate spacing. Said fifty sensor elements are connected to the four-phase CCD shift register 14 and form the basic element of the linear sensor row. Thirty basic elements are then required for an image width of 30 cm. The arrow 19 marks the charge transport in the CCD chain.

It will be apparent that many modifications may be made without departing from the scope of the teachings and concepts of the present invention.

We claim as our invention:

1. An arrangement for the contact-free measurement of electrical charge images which are stored as transmission images on a photoconductor plate by means of electroradiographic recording methods and in which the electrical charge image is scanned to obtain an image representing signal for representing said charge image, which image representing signal can be displayed on a video display screen, characterized in that a matrix of integrated MOS components is provided having an array of floating gate means disposed for scanning of the electrical charge image, and respective individual integrated circuit means on a common substrate coupled with the respective floating gate means for producing individual signals representing the local charge state at respective regions of the charge image and for electrically amplifying such individual signals at the same time.

2. An arrangement according to claim 1, characterized in that said individual integrated circuit means each comprises a sensor field effect transistor and a further transistor, said floating gate means comprising a floating gate of said sensor field effect transistor having a small input capacitance and serving as sensor for the charge state at a respective region of the charge image, said sensor field effect transistor being operated in a source-follower circuit with said further transistor, in that a transfer gate is coupled with said further transistor for providing a sensor output, and in that a charge transfer element is directly connected with the sensor outputs for supplying the image representing signal.

3. An arrangement according to claim 1, characterized in that said matrix is manufactured in MOS double polysilicon technology.

4. An arrangement according to claim 1, characterized in that the input capacitance of each individual integrated circuit means is smaller than 0.5 picofarad (0.5 pF).

5. An arrangement according to claim 1, further characterized in that a charge transfer element is coupled with the respective individual integrated circuit means and comprises a four phase CCD shift register, and further characterized in that a transfer gate is connected with the individual integrated circuit means for supplying the potential of the individual integrated circuit means to said shift register.

6. An arrangement according to claim 1, with a reset transistor connected with each of said floaing gate means, characterized in that said floating gate means is grounded by said reset transistor between charge sensing operations in order to avoid the charging of the floating gate means due to leakage currents.

7. An X-ray diagnostic system comprising a photoconductor plate sensitive to an X-ray image field to produce a corresponding electrical charge image, and an arrangement for the contact-free nondestructive detection of said charge image, said arrangement comprising a matrix of integrated MOS components having an array of floating gate means disposed in capacitively coupled relation to respective regions of the charge image of said photoconductor plate for sensing the local charge of the respective regions, and respective individual integrated circuit means on a common substrate coupled with the respective floating gate means for producing individual signals representing the local charge state at respective regions of the charge image and for electrically amplifying such individual signals at the same time, said matrix of MOS components providing a resolution of at least about 0.2 millimeter.

8. An X-ray diagnostic system according to claim 7, with said photoconductor plate comprising a selenium plate.

9. An arrangement for the contact-free measurement of electrical charge images which are stored on a photoconductor plate by means of electro-radiographic recording methods and in which the electrical charge image is scanned to obtain an image representing signal for representing said charge image, which image representing signal can be displayed on a video display screen, said arrangement comprising:
a linear sensor row of integrated sensor elements having an array of gate conductors disposed for scanning of the electrical charge image, said sensor elements comprising field effect transistors each having a gate electrode directly integrally connected with one of the gate conductors, and further transistors each forming part of an integrated circuit on a common substrate with one of the field effect transistors, and said linear sensor row of said integrated sensor elements including at least about fifty sensor elements per centimeter.

10. An arrangement according to claim 9, with said gate electrode of said field effect transistor having a small input capacitance and serving as sensor for the charge state at a respective region of the charge image, said field effect transistor being operated in a source-follower circuit with one of said further transistors on the common substrate therewith, and a transfer gate coupled with each of said sensor elements of said sensor row for providing a sensor output, and a charge transfer element having respective parallel inputs directly connected with the respective sensor outputs and having a serial output for supplying the image representing signal.

11. An arrangement according to claim 10, with said linear sensor row being manufactured in MOS double polysilicon technology and with each field effect transistor having an input capacitance smaller than 0.5 picofarad.

12. An arrangement according to claim 9, with a diffusion line leading from each integrated sensor element, and a transfer gate having inputs connected with the respective diffusion lines and operated such that the signals from the sensor elements can be read out at a desired time, and a shift register having parallel inputs for receiving the signals of the respective sensor elements under the control of said transfer gate, and having a serial output for supplying the signals from the respective sensor elements of the sensor row in sequence.

13. An arrangement according to claim 9, further characterized in that a transfer gate is coupled with the respective integrated sensor elements and a four phase CCD shift register having parallel inputs coupled with the transfer gate, said transfer gate being operated to read the signals from the sensor elements into the CCD shift register at a desired time.

14. An arrangement according to claim 13, with said sensor elements and said CCD shift register being manufactured in doubled polysilicon technology.

15. An arrangement according to claim 9, with a reset transistor connected with each of gate conductors, said reset transistor grounding said gate conductors between charge sensing operations in order to avoid the charging of the electrode gates of said field effect transistors due to leakage currents.

16. An arrangement according to claim 10, characterized in that the input capacitance of each field effect transistor is smaller than 0.5 picofarad.

17. An arrangement according to claim 9, characterized in that the input capacitance of each field effect transistor is smaller than 0.5 picofarad.

* * * * *